United States Patent [19]

Yamada et al.

[11] Patent Number: 4,905,058
[45] Date of Patent: Feb. 27, 1990

[54] LIGHT-EMITTING SEMICONDUCTOR DEVICE

[75] Inventors: Masato Yamada; Shinji Orimo; Takao Takenaka, all of Annaka, Japan

[73] Assignee: Shin-Etsu Handotai Company Limited, Tokyo, Japan

[21] Appl. No.: 226,542

[22] Filed: Aug. 1, 1988

[30] Foreign Application Priority Data

Jul. 31, 1987 [JP] Japan .................................. 62-190247

[51] Int. Cl.$^4$ ........................................... H01L 33/00
[52] U.S. Cl. ...................................... 357/17; 357/58; 357/60; 357/61; 357/90
[58] Field of Search ....................... 357/17, 58, 60, 61, 357/90

[56] References Cited

U.S. PATENT DOCUMENTS 4,745,612  5/1988  Hayakawa et al. ................... 357/17

FOREIGN PATENT DOCUMENTS 61183977  8/1960  Japan .

Primary Examiner—Edward J. Wojciechowicz
Attorney, Agent, or Firm—Lowe, Price LeBlanc, Becker & Shur

[57] ABSTRACT

In a light-emitting semiconductor device of double heterostructure consisting of GaAlAs mixed crystal, a film of $Ga_{1-y}Al_yAs$ having a thickness less than 1 μm is sandwiched in between a p-type clad layer of mixed crystal $Ga_{1-x1}Al_{x1}As$ and an n-type clad layer of mixed crystal $Ga_{1-z}Al_zAs$, whereby the wavelength of the emitted light is stabilized, and the thyristor phenomenon is curbed in the n-type clad layer, and at the same time the p-type carrier concentration is increased in the growth layer or in the substrate.

1 Claim, 2 Drawing Sheets

LIGHT-EMITTING SEMICONDUCTOR DEVICE

BACKGROUND OF THIS INVENTION

This invention relates to a light-emitting semiconductor device with a so-called double heterostructure.

A light-emitting semiconductor device is a device intended to create emission of visible rays or near infrared rays by conducting forward current through a semiconductor p-n junction. The demand for it is increasing in various application fields. Among others the light-emitting diode (hereinafter simply referred to as LED) can be used as a point light source such as pilot lamps or light sources forming different shapes of figures and letters such as display panels for use in various equipments such as facsimiles, LED printers, and many other office automation systems. Furthermore, automobile manufacturers are adopting LED as the light source of tail lamps, and many traffic signals are lit by LED. The field of application for LED is increasing in variety and speciality. As one of more specialized applications of LED, there is an infrared radiation unit in which LED performs as the point light source. It is these more specialized fields of application that particularly call for higher output of LED, that is, LED light sources of emitting very intense luminance.

The only compound semiconductors that are put to practical use are those made of semiconductors of III-V groups, and among all of them GaAlAs semiconductor has the highest luminous efficiency and is the champion material for such applications where high illumination is required. The lattice constant of GaAlAs is similar to that of GaAs, and the difference therebetween is 0.14% or so at the largest, so that the deformation caused by lattice dislocation is small and a high quality monocrystal is grown on a GaAs substrate. Further, an epitaxial film of GaAlAs can be grown in both liquid phase and gas phase, and especially the liquid-phase method can produce with less difficulty a high quality crystal of GaAlAs.

For the purpose of obtaining a highly luminous LED from a GaAlAs mixed crystal, a single heterostructure was devised; but it has been known that a double heterostructure makes an LED of still greater luminance. There are several known arts intended to further increase the luminance of the LED products based on double heterostructure. For example, Japanese Provisional Patent Publication (kokai) No. 61-183977 discloses an art according to which a p-type dopant Zn is doped in the active layer at a level slightly higher than the dopant level of the n-clad layer for the purpose of preventing lowering of the luminance, and this is effective enough to make up for the accompanying disadvantage of slight thickening of the active layer.

However, Zn, which is a p-type dopant, has a high diffusion coefficient, such that in a case where the active layer growth and the subsequent n-clad layer epitaxial growth are conducted by a method like the slow cooling method, the diffusion of Zn would outpace the solidification, and cause the p-n junction to shift into the original n-clad layer, whereby the light emission occurs in the clad layer. As a result of this, the wave length of the light emission may become different from the desired length.

Also, since n-type dopants (e.g. Te, Se, S) are liable to separate in GaAs and GaAlAs to thereby cause various defects, it is necessary to keep the carrier concentration low. Further, an infinitesimal but still unwelcome fluctuation in carrier concentration distribution is apt to occur in an epitaxial layer with low carrier concentration grown by liquid phase epitaxy. In other words, a problem exists that the Zn dopant doped richly in the p-clad layer and the active layer diffuses into the n-clad layer, and the said fluctuation of carrier concentration distribution that may occur in the n-clad layer would result in scattered formation of p-type inversion layers, and consequently in formation of thyristor structure.

It has been unsuccessful also to prevent these problems from occurring in the double heterostructure products produced from GaAlAs mixed crystals which are used in semiconductor lasers.

The present invention is intended to remedy the drawbacks of the prior art. It is, therefore, an object of the invention to improve the current and voltage characteristics of an LED to thereby obtain greater emission output from the LED.

SUMMARY OF THE INVENTION

According to the invention, this object is attained in the following manner: in a light-emitting semiconductor device of double heterostructure comprising GaAlAs mixed crystal, a film of $Ga_{1-y}Al_yAs$ having a thickness less than 1 μm is prepared as the active layer, and this layer is sandwiched in between a p-clad layer of mixed crystal $Ga_{1-x1}Al_{x1}As$ and an n-clad layer of mixed crystal $Ga_{1-z}Al_zAs$, so that the wavelength of the emitted light is stabilized, and the thyristor phenomenon is curbed in the n-cladding layer, and at the same time the p-type carrier concentration is increased in the growth layer as substrate or in the substrate.

More particularly, according to the invention, a light-emitting semiconductor device is proposed which is of a multilayer structure consisting of the following layers accumulated in the following order: a highly-doped substrate of a growth layer of a p-type mixed crystal $Ga_{1-x2}Al_{x2}As$ with carrier concentration $p_2$, a clad layer of $Ga_{1-x1}Al_{x1}As$ with carrier concentration $p_1$, a non-dope active layer of mixed crystal $Ga_{1-y}Al_yAs$, and an n-type mixed crystal $Ga_{1-z}Al_zAs$-clad layer having a uniform carrier concentration n; where the compositions of the mixed crystals are selected as follows: $y<x_1$, $y<z$, $0<x_1<1$, $0\leq x_2<1$, $0<y<1$, $0<z<1$; and the parameters $p_1$, $p_2$, and n are restricted, respectively, within the following limits:

$$1\times10^{17}cm^{-3}<n<5\times10^{17}cm^{-3}$$

$$1\times10^{16}cm^{-3}<p_1<3\times10^{17}cm^{-3}$$

$$5\times10^{17}cm^{-3}<p_2$$

and at the same time $p_1<n$.

In a light-emitting semiconductor device having a double heterostructure, such as the one according to this invention, the carrier injection efficiency is determined mainly by the height of the potential barrier which is a function of the difference between the width of the forbidden band of the n-clad layer and p-clad layer and that of the active layer. Also, an LED wherein the active layer is controlled to have a small width and the band construction is of direct transition type does not require much impurity as the emission center.

Therefore, according to the invention, the luminous characteristic with respect to the carrier concentration $p_1$ in the p-clad layer is kept substantially unchanged more widely than does the luminous characteristic with respect to the carrier concentration in the n-clad layer, so that there occurs no significant weakening in the luminance even if the carrier concentrations $p_1$ become as low as $10^{16} cm^{-3}$. By establishing a relationship $p_1 < n$, it is possible to prevent the p-n junction from having dislocation and thyristor which are caused by a diffusion of p-type impurity (Zn). Also, since the carrier concentration n in the n-clad layer and the carrier concentration $p_1$ in the p-clad layer are kept to a low level, it is possible to prevent impurities from degrading the crystallinity of the LED. Furthermore, since the carrier concentration $p_2$ in the p-type highly doped substrate, or the growth layer, (hereinafter called as the p-type substrate or growth layer) adjacent the p-clad layer is kept high, it is possible to control the forward-direction resistance of the light-emitting semiconductor device to be low.

BRIEF DESCRIPTION OF THE DRAWING

One way of carrying out the invention is described in detail below with reference to drawings which illustrate only one specific embodiment, wherein:

FIG. 1 (b) is a drawing showing a configuration of a chip composed of the light-emitting semiconductor device of FIG. 1 (a);

DETAILED DESCRIPTION

Figure 1A:
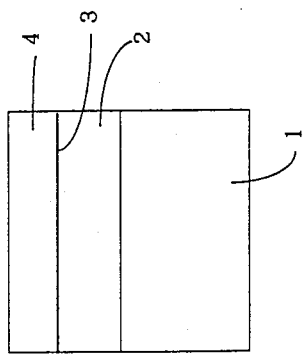
FIG. 1 (a) is a drawing showing a configuration of a light-emitting semiconductor device according to the invention.
Figure 1B:
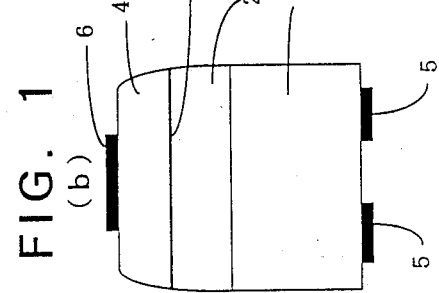

In FIG. 1 (a), which is a cross section showing the construction (epitaxial construction) of a light-emitting semiconductor device according to the invention, reference numeral 1 designates a p-type GaAlAs growth layer (where let $p_2$ be the carrier concentration), on which layer 1 three epitaxial layers 2, 3, and 4 are formed consecutively. More specifically, the p-type $Ga_{0.2}Al_{0.8}As$-clad layer 2, which has a high compound ratio of Al to As in atoms, is grown in the form of a 10 μm-thick crystal over the GaAlAs layer 1 (carrier concentration $p_2$); the p-clad layer 2 (carrier concentration $p_1$) is doped with Zn as an impurity. A $Ga_{0.65}Al_{0.35}As$ active layer 3, having a thickness of $0.6 \pm 0.2$ μm and a crystal ratio appropriate for the wave length of a required light emission, is formed on the p-clad layer 2; although no impurity is doped in the active layer 3 (non-dope layer) this layer is turned to p-type for it is subject to automatical doping from the p-clad layer 2. Formed on this active layer 3 is an n-type $Ga_{0.2}Al_{0.8}As$-clad layer 4 (carrier concentration n) having a thickness of $30 \pm 10$ μm and a component ratio of Al to As in atoms ratio similar to that of the p-clad layer 2; the n-clad layer 4 is doped with Te as an n-type impurity.

Incidentally, the p-clad layer 2, the active layer 3, and the n-clad layer 4 are fabricated through the liquid phase epitaxial growth in accordance with the known slow cooling method.

A chip as shown in FIG. 1 (b) is obtained by forming Au p-electrodes 5, 5 over the bottom face of the GaAlAs layer 1 of the light emitting semiconductor device constructed as described above, and by forming an Au n-electrode 6 on the top face of the n-clad layer 4.

Figure 2:
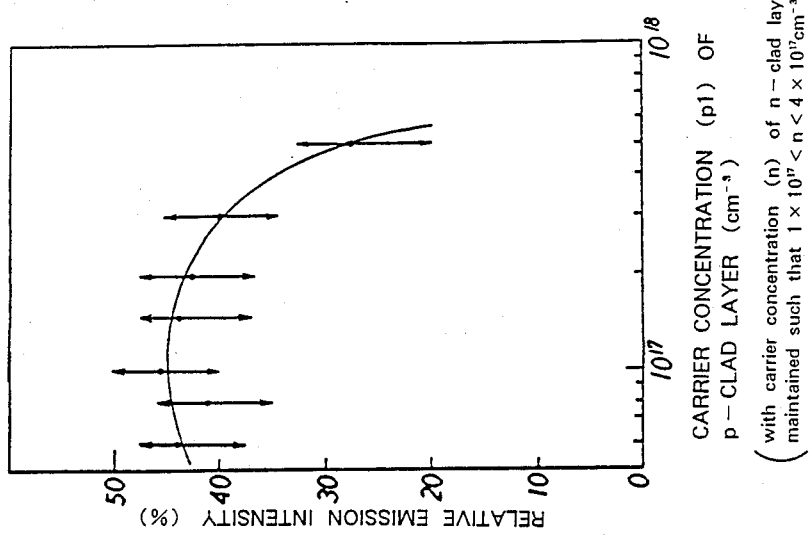
FIG. 2 is a graph showing a relationship between the relative emission power and the carrier concentration.
Figure 3:
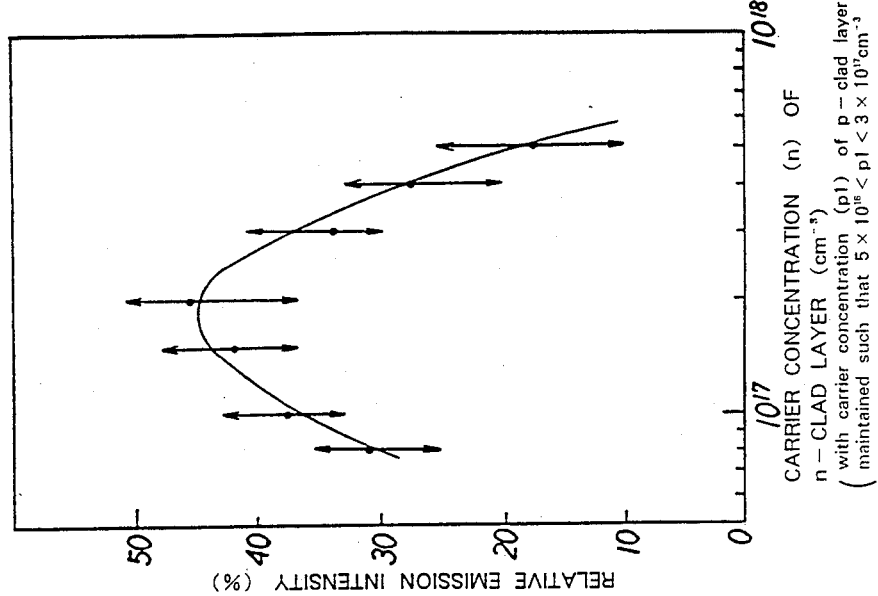
FIG. 3 is a graph showing another example of the same relationship as in FIG. 2.

Generally, in an LED having a double heterostructure such as the LED according to this invention, the carrier injection efficiency is primarily determined by the potential barrier due to the differences of the forbidden band widths of the n-clad layer 4 and the active layer 3, and of the p-clad layer 2 and the active layer 3. Also, an LED whose active layer 3 is controlled to have a small width and which has a band of direct transition type does not require much impurities to form the emission center. FIG. 2 shows a relationship between the relative emission intensity of the LED semiconductor device and the carrier concentration $p_1$ of its p-clad layer 2, and FIG. 3 shows a relationship between the relative emission intensity of the LED semiconductor device and the carrier concentration n of its n-clad layer 4. As is apparent from the two figures, the relative emission intensity of the p-clad layer 2 takes high values over a considerably wider range of the carrier concentration (roughly over the range of $5 \times 10^{16} cm^{-3} < p_1 < 3 \times 10^{17} cm^{-3}$) than does the relative emission intensity of the n-clad layer 4. Incidentally, as described earlier, the active layer 3 has been rendered to become p-type due to the automatical doping from the p-clad layer 2, so that the emission intensity of the LED semiconductor device depends greatly on the carrier concentration $p_1$ of the p-clad layer 2.

It follows from this that, since the relative emission intensity assumes high values over a relatively wide range of the carrier concentration $p_1$ of the p-clad layer 2, it is possible to make the carrier concentration $p_1$ smaller than the carrier concentration n of the n-clad layer 4 (i.e. to realize $p_1 < n$); whereby it becomes possible to prevent the dislocation at the p-n junction and occurrence of thyrister thereabout which are caused when the p-type dopant diffuses into the n-clad layer. As a result, the resulting LED semiconductor device will have a very stable light emitting characteristic. In order to prevent the impurities from degrading the crystallinity of each layer, it is desirable to reduce the carrier concentrations in the respective layers.

For the reasons stated above, it is preferable, in view of maintenance of high emission intensity of the mixed crystal GaAlAs light emitting diode with a double heterostructure of the invention and in view of prevention of dislocation at the p-n junction and formation of the thyrister structure, that the carrier concentration $p_1$ of the p-clad layer 2 and the carrier concentration n of the n-clad layer 4 are confined to the following regions, respectively:

$$5 \times 10^{16} cm^{-3} < p_1 < 3 \times 10^{17} cm^{-3}$$

$$1 \times 10^{17} cm^{-3} < n < 5 \times 10^{17} cm^{-3}.$$

Figure 4:
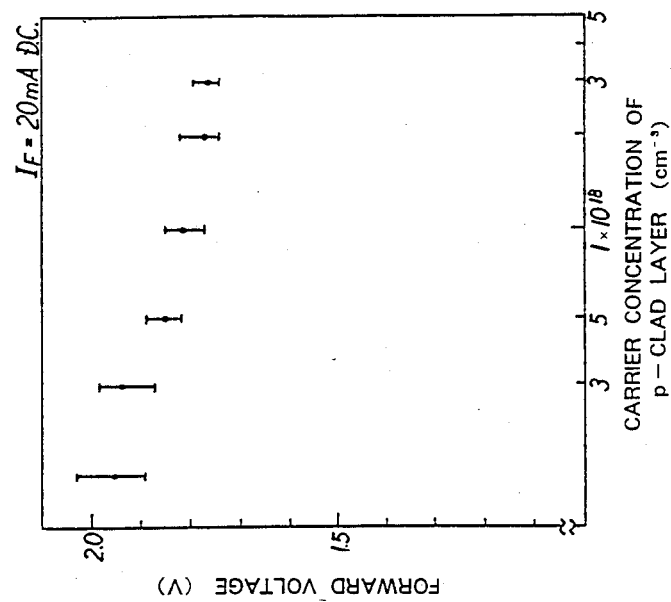
FIG. 4 is a graph showing a relationship between the electrical resistivity (in terms of forward voltage) and the carrier concentration.

FIG. 4 shows a relationship between the carrier concentration $p_2$ of the p-type substrate (or the growth layer 1) and the forward voltage applied through the light emitting diode, wherefrom it is understood that the carrier concentration $p_2$ of the growth layer 1 should be relatively high if one wishes to keep the resistivity low; in particular $p_2$ is preferably greater than $5 \times 10^{17} cm^{-3}$.

Summing up, the desirable effects stated so far can be obtained only if the carrier concentrations $p_1$, $p_2$, and n in the p-type substrate (or the growth layer 1), the p- clad layer 2, and the n-clad layer 4 simultaneously satisfy the following inequalities:

$$1 \times 10^{17} \text{cm}^{-3} < n < 5 \times 10^{17} \text{cm}^{-3}$$

$$5 \times 10^{16} \text{cm}^{-3} < p_1 < 3 \times 10^{17} \text{cm}^{-3}$$

$$5 \times 10^{17} \text{cm}^{-3} < p_2$$

$$p_1 < n.$$

Incidentally, the above explanation has focused on a p-type GaAlAs layer as an example of the p-type growth layer 1, but the present invention is also applicable in the case of p-type GaAs monocrystal substrate. The p-type GaAlAs layer as a p-type growth layer 1 can be formed by first preparing a GaAs monocrystal substrate, then growing a thick layer of p-type GaAlAs epitaxial layer over the GaAs monocrystal substrate, and removing the GaAs monocrystal substrate. Here, the substrate refers to a monocrystal film which is manufactured through a process separate from the process of this invention, such as Czochralski method.

Further, in the above embodiment, the composition of the mixed GaAlAs light-emitting diode with double-hetero structure is set such that the optimum visible light is obtained; but the present invention is applicable as well to infrared ray emitting diodes, and if infrared radiation having a wavelength of 0.85 μm, for example, is desired, the appropriate composition to be selected will be:

$$y \approx 0.03$$

$$0.2 < x_1 < 0.4$$

$$0.2 < z < 0.4.$$

While the invention has been particularly shown and described with reference to preferred embodiments thereof, it will be understood by those skilled in the art that the foregoing and other changes in form and details can be made therein without departing from the spirit and scope of the invention.

What is claimed is:

1. A light-emitting semiconductor device of a multilayer structure consisting of the following layers accumulated in the following order: a highly-doped substrate or a growth layer of a p-type mixed crystal $Ga_{1-x2}Al_{x2}As$ with carrier concentration $p_2$, a clad layer of $Ga_{1-x1}Al_{x1}As$ with carrier concentration $p_1$, a non-dope active layer of mixed crystal $Ga_{1-y}Al_yAs$, and an n-type mixed crystal $Ga_{1-z}Al_zAs$-clad layer with carrier concentration n; where the compositions of the mixed crystals are selected as follows:

$$y < x_1,$$

$$y < z,$$

$$0 < x_1 < 1,$$

$$0 \leq x_2 < 1,$$

$$0 < y < 1,$$

$$0 < z < 1;$$

and the parameters $p_1$, $p_2$, and n are restricted, respectively, within the following limits:

$$1 \times 10^{17} \text{cm}^{-3} < n < 5 \times 10^{17} \text{cm}^{-3}$$

$$1 \times 10^{16} \text{cm}^{-3} < p_1 < 3 \times 10^{17} \text{cm}^{31\ 3}$$

$$5 \times 10^{17} \text{cm}^{-3} < p_2$$

and at the same time $p_1 < n$.

* * * * *